(12) United States Patent
Saint Clair et al.

(10) Patent No.: US 7,965,754 B1
(45) Date of Patent: Jun. 21, 2011

(54) SPHERICAL ARRAY LASER SOURCE

(75) Inventors: Jonathan M. Saint Clair, Seattle, WA (US); Eric Yuen-Jun Chan, Mercer Island, WA (US)

(73) Assignee: The Boeing Company, Chicago, IL (US)

( * ) Notice: Subject to any disclaimer, the term of this patent is extended or adjusted under 35 U.S.C. 154(b) by 123 days.

(21) Appl. No.: 12/427,253

(22) Filed: Apr. 21, 2009

(51) Int. Cl.
*H01S 5/00* (2006.01)
(52) U.S. Cl. .................................. 372/50.12; 372/50.123
(58) Field of Classification Search .................. 372/108, 372/101, 29.011, 50.12
See application file for complete search history.

(56) References Cited

U.S. PATENT DOCUMENTS

| | | | | |
|---|---|---|---|---|
| 5,309,277 | A * | 5/1994 | Deck | 359/387 |
| 5,631,778 | A * | 5/1997 | Powell | 359/724 |
| 5,888,885 | A | 3/1999 | Xie | |
| 6,939,027 | B2 * | 9/2005 | Harumoto | 362/336 |
| 7,408,969 | B2 * | 8/2008 | Hilliard | 372/57 |

OTHER PUBLICATIONS

Barnard, C. W. et at, "Mode transforming properties of tapered single-mode fiber microlenses", Applied Optics, vol. 32, No. 12, p. 2090, Apr. 1993.
Fan,T.Y., Efficient coupling of multiple diode lser arrays to an optical fiber by geometric multiplexing, Applied Optics, vol. 30, No. 6, p. 630, Feb. 1991.
Ledentsov, N. N.,et al, Seld-organized InGaAs quantum dots for advanced applications in optoelectronics, J.Appl Phyics, vol. 41, pp. 949-952, 2002.
Wagner, R. E., et al, Coupling efficiency of optics in single-mode fiber components, Applied Optics, vol. 21, No. 15, p. 2671m Aug. 1982.
Shiraishi, K., New scheme of coupling single mode fibers: a beam expanding fiber with hemispherical end, Applied Optics, vol. 29, No. 24, p. 3469, Aug. 1990.
Mathis, R.F., Efficient Coupling of Noncoherent Light to Fiber Optic Light Guides, SPIE vol. 3139, 1997.
Burin, A. L. et al., High-quality optical modes in low-dimensional arrays of nanoparticles: application to random lasers, J. Opt. Soc. Am. B, vol. 21, No. 1, Jan. 2004.
Rahman, L. et al., Improved coupled-mode theory for the dynamics of semiconductor laser arrays, Optics Letters , vol. 18, No. 2 , Jan. 15, 1993.
Zhang, Q. et al., Large ordered arrays of single photon sources based on II-VI semiconductor colloidal quantum dot, Optics Express vol. 16, No. 24, Nov. 2008.
Leger, J.R., et al., Modal properties of an external diode-laser-array cavity with diffractive mode-selecting mirrors, Applied Optics, vol. 34, No. 21, Jul. 20, 1995.
Hadley, R. G., Modes of a two-dimensional phase-locked array of vertical-cavity surface-emitting lasers, Optics Letters, vol. 15, No. 21 , Nov. 1, 1990.
Morgan, R.A. et al., Optical characteristics of two-dimensional coherently coupled vertical-cavity surface-emitting laser arrays, Optics Letters, vol. 18, No. 5, Mar. 1, 1993.
Zhu, H. et al., Spectrally narrowed external-cavity high-power stack of laser diode arrays, Optics Letters, vol. 30, No. 11, Jun. 1, 2005.

* cited by examiner

*Primary Examiner* — Minsun Harvey
*Assistant Examiner* — Tuan N. Nguyen
(74) *Attorney, Agent, or Firm* — Felix L. Fischer

(57) ABSTRACT

A laser cavity is provided by a reflecting spherical substrate with an array of emitters having a mode size. Each emitter has an axis aligned with a radius of the spherical substrate. A single mode waveguide is aligned with the array at an optical coupling distance less than the radius of the spherical substrate. A reflector substantially coincident with an end of the waveguide combines with the reflecting spherical substrate as a cavity.

25 Claims, 13 Drawing Sheets

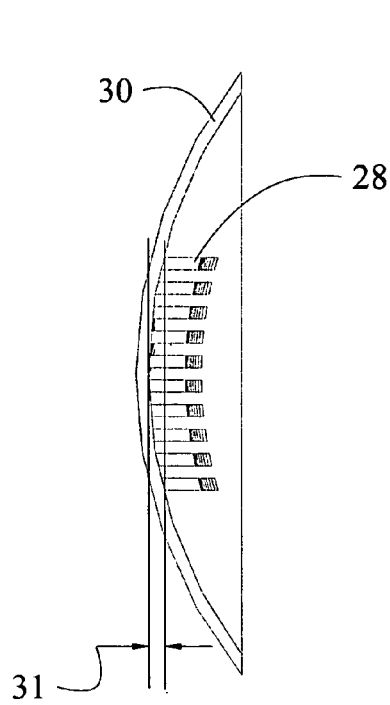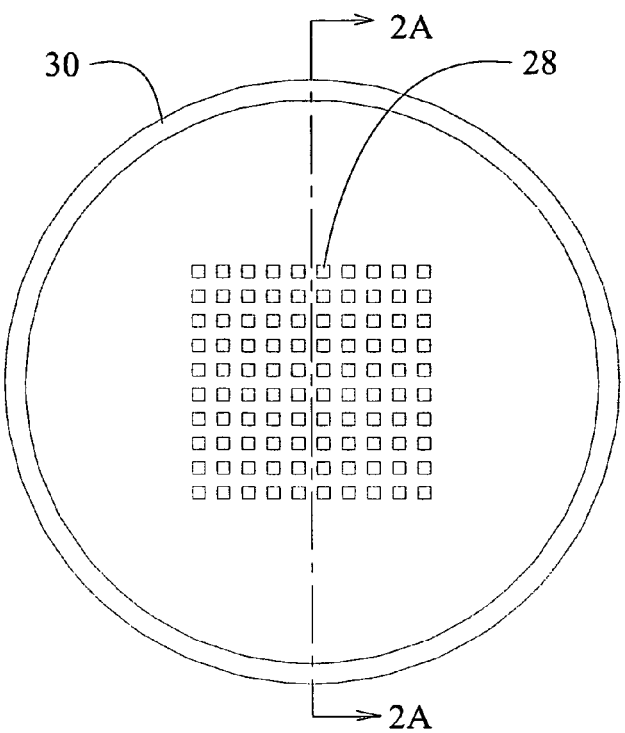
FIG. 2A   FIG. 2B
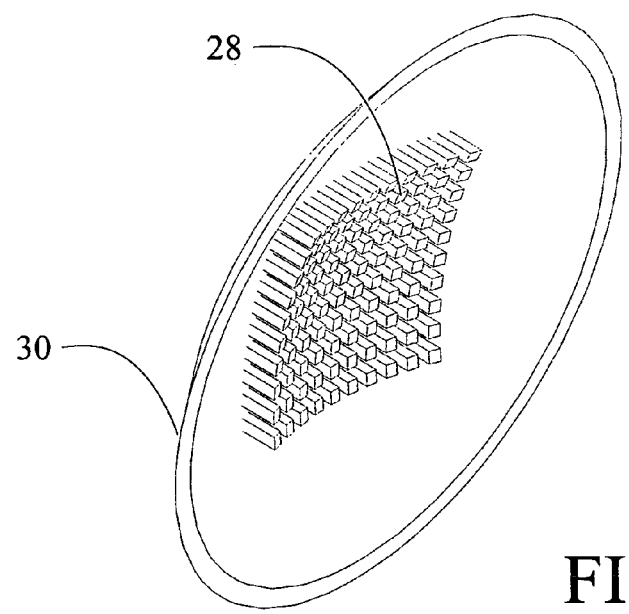
FIG. 2C

SPHERICAL ARRAY LASER SOURCE

BACKGROUND INFORMATION

1. Field

Embodiments of the disclosure relate generally to the field of laser sources for fiber coupling and more particularly to embodiments for spherical mounting of an array of laser sources for coupling to single mode fiber with mode matching.

2. Background

Arrays of semiconductor laser sources are difficult to couple into single mode waveguides efficiently therefore affecting the efficiency of laser sources and optical amplifiers. Typical approaches to provide coupling employ planar arrays of emitters, and combine the output of the array by various methods that include splicing of single mode fibers from individual emitters, complex optical assemblies to focus planar array output onto the sides of fiber, optical arrangements coupling light into the ends of fibers. These approaches typically result in lossy coupling of light into fibers, reducing the efficiency of the fiber coupled source.

It is therefore desirable to provide a source array structure which provides improved coupling into a fiber or waveguide. It is also desirable to provide coherent combination of large numbers of emitters to achieve high optical output power in a compact form factor.

SUMMARY

Exemplary embodiments provide a laser source employing a reflecting spherical substrate and an array of emitters coincident with the spherical substrate and having a transverse extent greater than or equal to the extent of the fundamental cavity mode at the spherical substrate, referred to herein as a mode dimension. Each emitter has an emission axis of symmetry aligned with a radius of the spherical substrate. A single mode waveguide is aligned with the array at an optical coupling distance less than the radius of the spherical substrate. A reflector substantially coincident with an end of the waveguide combines with the reflecting spherical substrate to form a cavity.

In various alternate embodiments, the emitters in the array are vertical cavity surface emitting lasers (VCSELs), stripe geometry devices or quantum dots. A lenslet array may be provided in certain embodiments between the emitters and fiber end.

In one exemplary embodiment the laser cavity incorporates a reflecting spherical substrate and an array of VCSEL emitters deposited on a second concentric spherical substrate and having a mode dimension. The second spherical substrate is mounted to the reflecting spherical substrate with each emitter having an axis aligned with a radius of the spherical substrate. A single mode fiber having an end at an optical coupling distance less than the radius of the reflecting spherical substrate has an optical axis in alignment with a radius of the reflecting spherical substrate central to the VCSEL array. A lenslet array is placed intermediate the VCSEL array and the single mode fiber. The lenslet array has a reflecting surface or anti-reflective (AR) coating on the surface in alternative embodiments. A reflector substantially coincident with an end of the fiber combines with the reflecting spherical substrate as a cavity.

Additionally, the fiber end may have a hemispherical end or a hemispherical end with a diameter greater than a diameter of the fiber with the fiber further having an interface portion with a tapered diameter from the hemispherical end to the fiber diameter and index for matching modes between the emitter array and fiber.

In another exemplary embodiment, the laser cavity employs multiple substrates, each substrate having multiple stripe geometry devices fabricated thereon. The stripe geometry devices on each substrate are aligned on a radius of a first circle and each of the substrates is aligned in spaced relation perpendicular to a second circle, said first and second circle defining a sphere. A reflective substrate is placed coincident with the sphere. A single mode fiber having an end at an optical coupling distance less than the radius of the reflective substrate is aligned with an optical axis of the fiber on a radius of the reflecting substrate central to the stripe laser array. A reflector substantially coincident with an end of the fiber combines with the reflecting spherical substrate to form a cavity.

Each of the embodiments may be fabricated by providing an emitter array with a spherical convergence pattern from the emitters and with a predefined mode size at a radius greater than an optical coupling distance to a single mode fiber. A reflecting spherical substrate is provided coincident with the emitter array to act as a first reflector in the cavity. A second reflector for the cavity at the optical coupling distance is provided coincident with an end of the fiber. A lenslet array may be provided for control of light input and output from the emitter array.

The features, functions, and advantages that have been discussed can be achieved independently in various embodiments of the present invention or may be combined in yet other embodiments further details of which can be seen with reference to the following description and drawings

BRIEF DESCRIPTION OF THE DRAWINGS

FIG. 2A is a side section view of a vertical cavity surface-emitting laser (VCSEL) array mounted on a spherical substrate;

FIG. 2B is a front view of the VCSEL array and substrate of FIG. 2A;

FIG. 2C is an isometric view of the VCSEL array and substrate of FIG. 2A;

DETAILED DESCRIPTION

Figure 1:
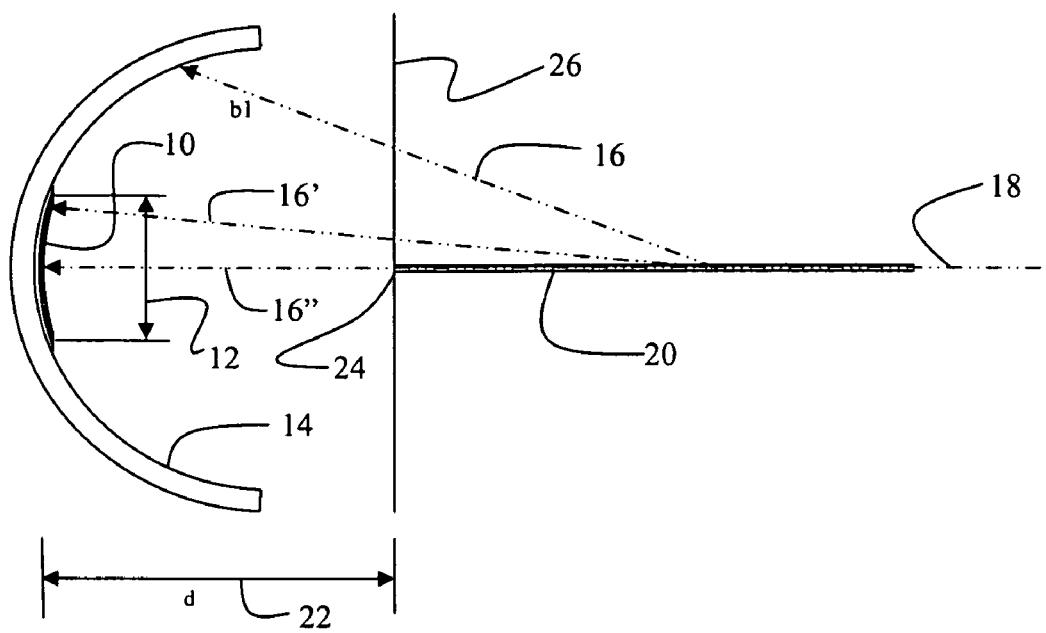
FIG. 1 is a side section view of an exemplary embodiment.

The embodiments disclosed herein provide spherical arrangement of the emission axes of an array of semiconductor optical emitters which are coupled with a partially transmitting reflector located near the center of curvature of the spherical geometry as will be described with respect to Table I subsequently. The transmitted optical field is coupled into a single mode waveguide or single mode fiber, such that the waveguide mode matches the cavity mode at the reflector. Referring to FIG. 1, an array of emitters 10 having a mode dimension 12 is mounted on a reflecting spherical substrate 14 having a radius 16. For the embodiment shown a circular array with a diameter greater than or equal to the mode dimension 12 is employed. Curvatures in FIG. 1 have been exaggerated. Exemplary emitters for a first embodiment are Vertical Cavity Surface-Emitting Lasers (VCSELS) described in greater detail subsequently. The spherical substrate is mounted and aligned so that the radius line 16' of the sphere that goes through the center of the array of emitters is co-linear with the optical axis 18 of an optical fiber or waveguide 20 which is the transmission output path for the laser source.

Alignment of the single mode fiber to the spherical emitter array is accomplished for the embodiments described by actively optimizing the position of the fiber end in Cartesian dimensions (x, y, z) relative to the center of curvature and angular reference directions (θ and φ) between the sphere radii and fiber optical axis. The process for active optimization will be described in greater detail subsequently with respect to FIG. 10. After the active alignment, the fiber is fixed by a fiber "locking" technique using soldering or laser welding. The axis of emission of each VCSEL is aligned with a radius of the sphere as represented by radius 16". Relative mounting of the spherical substrate and fiber provide an optical coupling distance 22 from the spherical array to the fiber input face 24 for the optical cavity. The radius of the reflecting spherical substrate is slightly greater than the optical coupling distance. A planar reflector 26 perpendicular to the fiber extends adjacent the input face of the fiber forming one element of the cavity, with the spherical array of optical emitters mounted on or for an emission surface substantially coincident with the reflecting spherical substrate forming the other element.

The embodiment of FIG. 1 provides a configuration with the optical coupling distance 22 less than the radius 16 of the spherical substrate for the cavity. Table 1 presents exemplary values of the cavity parameters for embodiments of the form disclosed in FIG. 1 for which the lowest order cavity mode and the fiber mode match sufficiently well to achieve 90% coupling efficiency into a 10 micron core single mode fiber wherein "d" represents the optical coupling distance 22, "W1" represents the array mode dimension 12 in microns and "b1" represents the radius 16 of the spherical substrate.

TABLE 1

| d (cm) | b1-d (microns) | W1 (microns) |
|---|---|---|
| 1 | 4.4 | 477 |
| 10 | .44 | 4770 |
| 100 | .044 | 47700 |

The advantage of employing VCSELS in the exemplary first embodiment is their low threshold currents and high power vs. current slope efficiency, which translate to higher wall plug efficiency. The configuration provided by the first embodiment overcomes the disadvantage of VCSELS, which is that they tend to be low power. Arrays of VCSELS are available with 1 kW power output but only multimode. The embodiment disclosed would provide approximately 1 kW single mode output.

For an embodiment incorporating an array of VCSELS with 50 micron pitch there would be on the order of 9000 VCSELS. If each VCSEL can produce approximately 100 mW, then the disclosed embodiment would couple approximately 810 W assuming 90% coupling efficiency into the single mode fiber with high wall plug efficiency.

An example VCSEL array for use with the embodiment described with respect to FIG. 1 is shown in FIGS. 2A, 2B and 2C. A spherical array is defined by conforming a VCSEL array 28 to second spherical substrate 30. VCSELS may be fabricated directly on a spherical substrate to establish the spherical geometry. This may be accomplished without excessive alignment requirements, since the cavity will operate based on those elements that ultimately reside in the mode dimension. The array is fabricated larger than the designed mode dimension at the spherical substrate, so that the array can be rotated about the center of curvature to achieve good alignment as will be described subsequently. The larger the array is the more angular range is available to obtain good alignment. The spherical substrate will not be difficult to fabricate since the depth of the sagitta or segment height 31 in FIG. 2A is only 29 microns, in the embodiments described above, so the depth of the spherical cavity in the substrate is only that value minus the height of the VCSELS. The bias and current return network (as will be described in greater detail subsequently) may be fabricated directly on the substrate, before the VCSELS are deposited.

Implementation of VCSEL embodiments as described may be accomplished wherein the only reflecting substrate is that reflector intrinsic to each of the VCSELs. Alternatively, the substrate is pre-coated with a reflective coating before the VCSELs are deposited thereby providing reflecting surface on the substrate between the individual VCSELs coincident with the intrinsic reflectors. In yet another embodiment, instead of VCSELs, Vertical-Cavity Semiconductor Optical Amplifiers (VCSOAs) are deposited, which are VCSELs without the intrinsic reflectors. In that case the reflective pre-coating of the substrate is required providing a common reflector for the entire VCSOA array. Both types of Vertical-Cavity Semiconductor Optical Device will be referred to generally herein as VCSELs.

Using an epitaxial lift-off technique as opposed to forming the array directly on the substrate, the VCSEL array is deposited on a very thin III-V compound semiconductor epitaxial layer with multiple quantum well structures. This allows fabrication of the array in a planar geometry. The epitaxial layer is directly attached to and flush with the spherical reflector surface. This technique will have no "lattice matching" issue with the material of spherical reflector surface. The lenslet array is fabricated monolithically with high precision photolithography process. The lenslet array and the VCSEL array have matching fiducial marks for precise alignment to emitting aperture of each VCSEL in the VCSEL array layer. An exemplary process is to attach and align the lenslet array to the VCSEL array on a lifted-off epitaxial layer, and then assemble the combined arrays onto the spherical surface.

Figure 3:
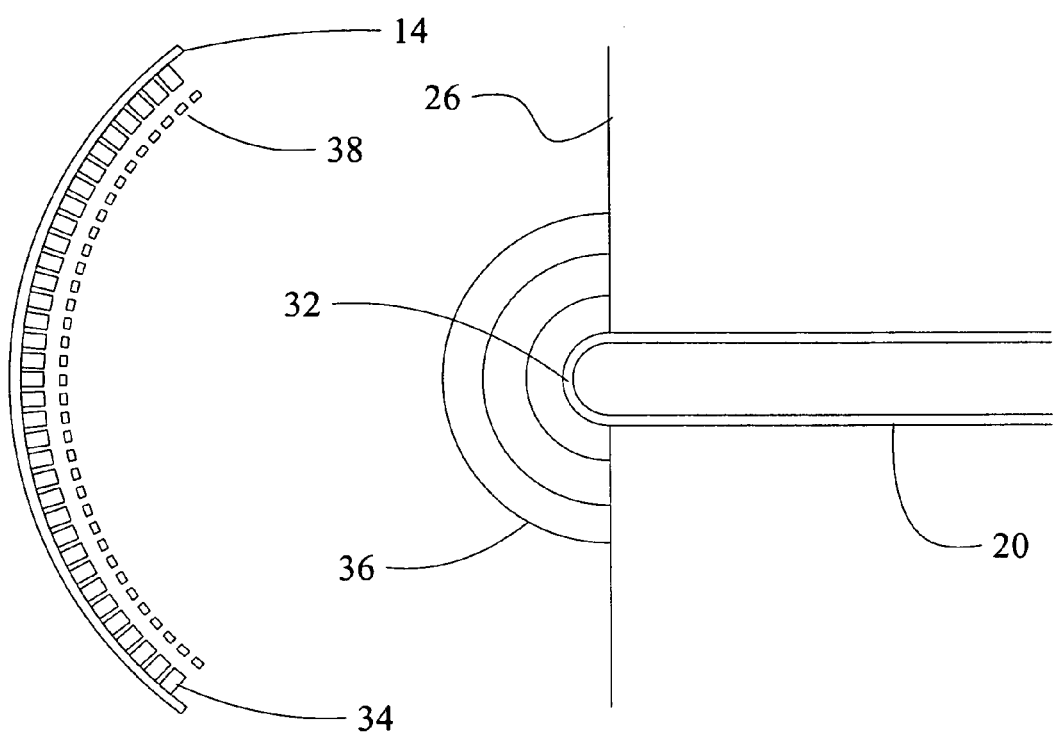
FIG. 3 is a side section view of a first embodiment of the cavity employing a hemispherical end on the fiber and a lenslet array.

A second embodiment is shown in FIG. 3 which employs a hemispherical tip 32 on fiber 20 in conjunction with reflecting spherical substrate 14 as shown in the initial embodiment. The hemispherical tip is aligned with the center of VCSEL array 34 and employs a partially reflective coating. A wavefront 36 from the hemispherical tip is reflected to the spherical substrate. The transmittance/reflectance of the coating is predetermined based on desired cavity performance.

A lenslet array 38 may be employed in conjunction with the VCSEL array 34 to further control the light input and output for the VCSELs in the array. For the embodiment shown, the lenslet array incorporates an AR coating to maintain the two reflector cavity. The lenslet array may alternatively include a reflective coating to provide a three reflector laser cavity.

For the embodiment shown in FIG. 3, reflector 26 as disclosed in the initial embodiment is employed as a portion of the cavity. In alternative embodiments the reflector may be limited to the diameter of the fiber, i.e. the reflective coating of the fiber end itself.

Figure 4:
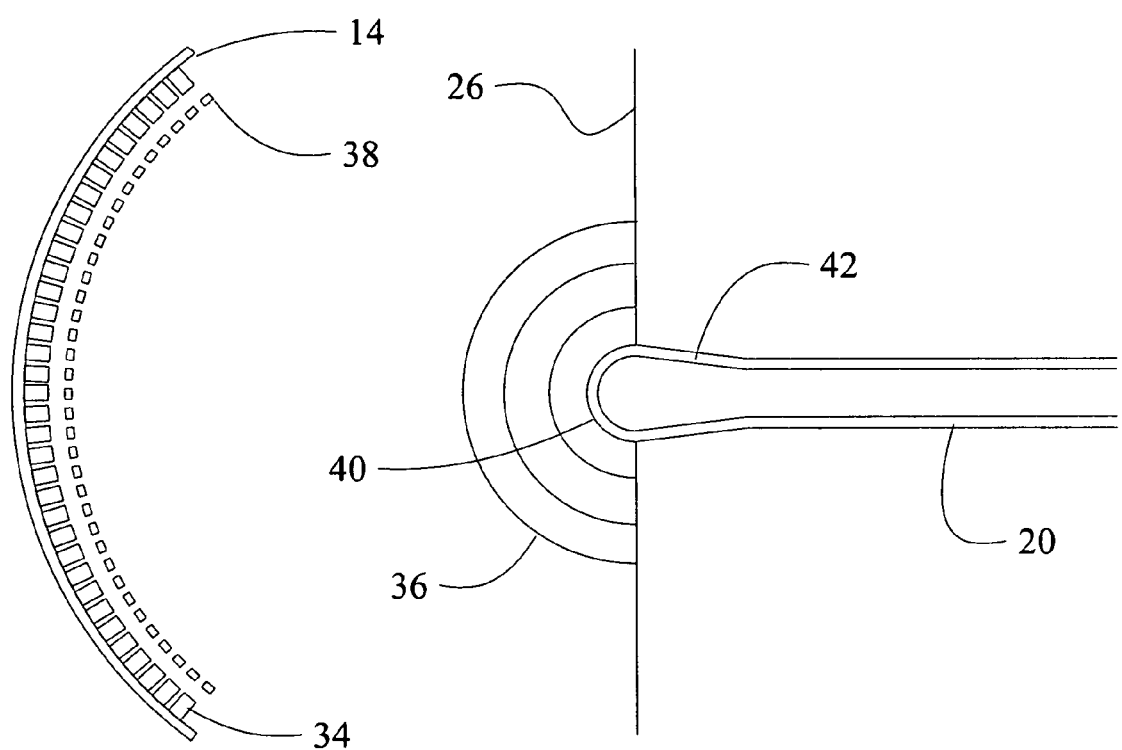
FIG. 4 is a side section view of a second embodiment of the cavity employing a fiber with a hemispherical end of greater diameter and a tapered portion for mode matching between the fiber and cavity.

Another embodiment is shown in FIG. 4 wherein the fiber end employs a hemispherical tip 40 having a larger diameter than fiber 20 and an interface portion 42 having a tapered diameter and index for matching modes between the VCSEL array and fiber. As in the previously described embodiment, lenslet array 38 may be employed in conjunction with the VCSEL array 34 to further control the VCSEL array light output and input for the VCELS.

Figure 5:
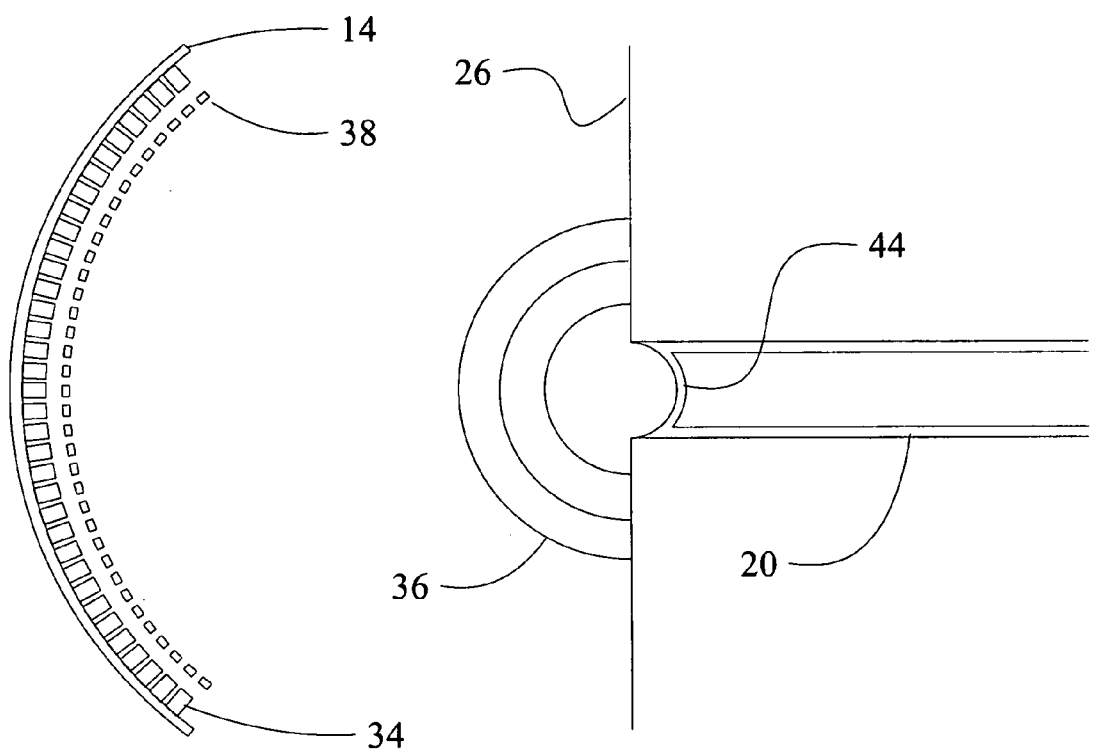
FIG. 5 is a side section view of a third embodiment of the cavity employing a fiber with a concave end.

FIG. 5 shows yet another embodiment wherein the fiber tip incorporates a concave surface 44 for mode matching.

For each of the embodiments shown in FIGS. 3, 4 and 5, the process for forming the spherical tip 40 and taper portion of the fiber 42 is referred to as the fiber "ball lensing" process. Ball lensing is accomplished for the embodiments described herein using a fiber fusion splicer with a pair of controlled arcing electrodes beside the flat unlensed fiber tip. The ball lens diameter and the taper dimension are controlled by varying the fusion splicer's arcing parameters such as time duration and intensity. Typical ball lens diameter is around 160 microns for a 9/125 micron single mode fiber. The taper dimension complies with the ball lens diameter to form a smooth transition region. Index matching fluid or gel can be used to coat the single mode fiber for mode matching purposes.

Figure 6A:
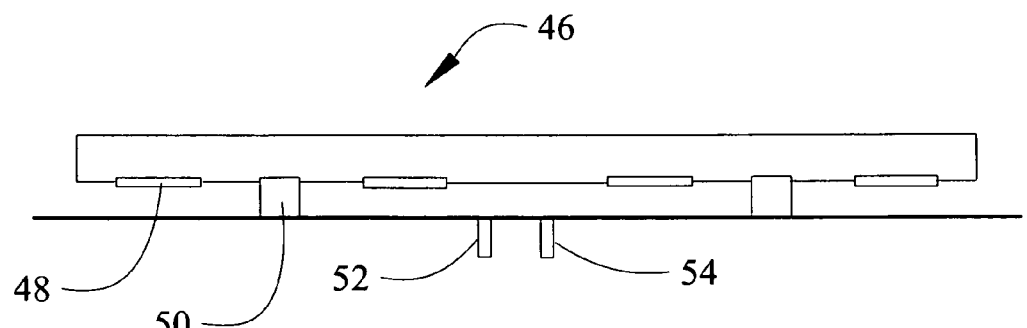
FIGS. 6A and 6B are side section and top views of a multi-layer bias and current return network for the emitter array.
Figure 6B:
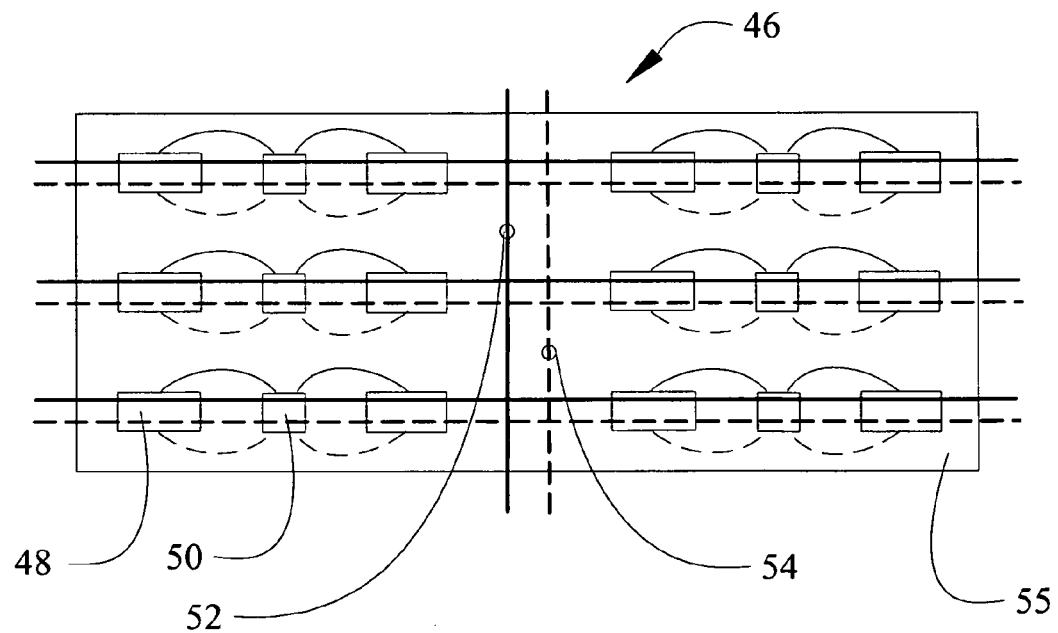

A multi-layer bias and current return network 46 for the embodiments disclosed is shown in FIGS. 6A and 6B in side section and top views respectively. The network distributes bias voltages and manages the current distribution for the emitters in the array. Gain elements 48 are laterally spaced from distribution nodes 50 which interconnect ground network conductors 54 and bias network conductors 52. The network pattern in one embodiment would be printed on a membrane 55 of flexible material, like a polymer, affixed to the curved surface of the array of emitters, and bonded to the reflecting spherical substrate 14 as described with respect to epitaxial lift off forming of the VCSEL array. Alternatively, the flexible material of the membrane is treated by polishing or coating and then deformed to serve as reflecting spherical substrate 14 and to generate the correct shape for a high Q cavity. The pattern may also alternatively be deposited directly onto the curved mirror surface of reflecting spherical substrate 14.

Figure 7A:
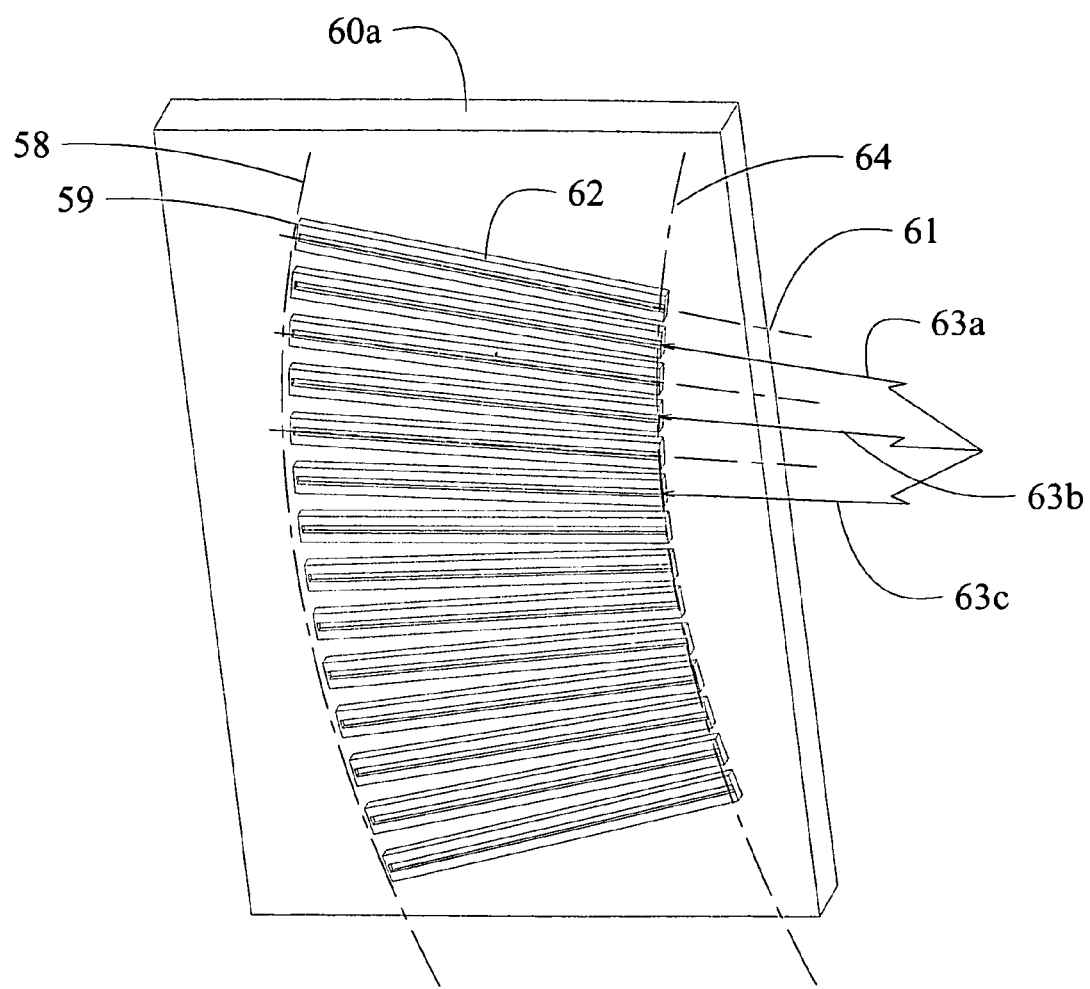
FIG. 7A is a face view of a substrate incorporating multiple stripe geometry devices with radial convergence.
Figure 7B:
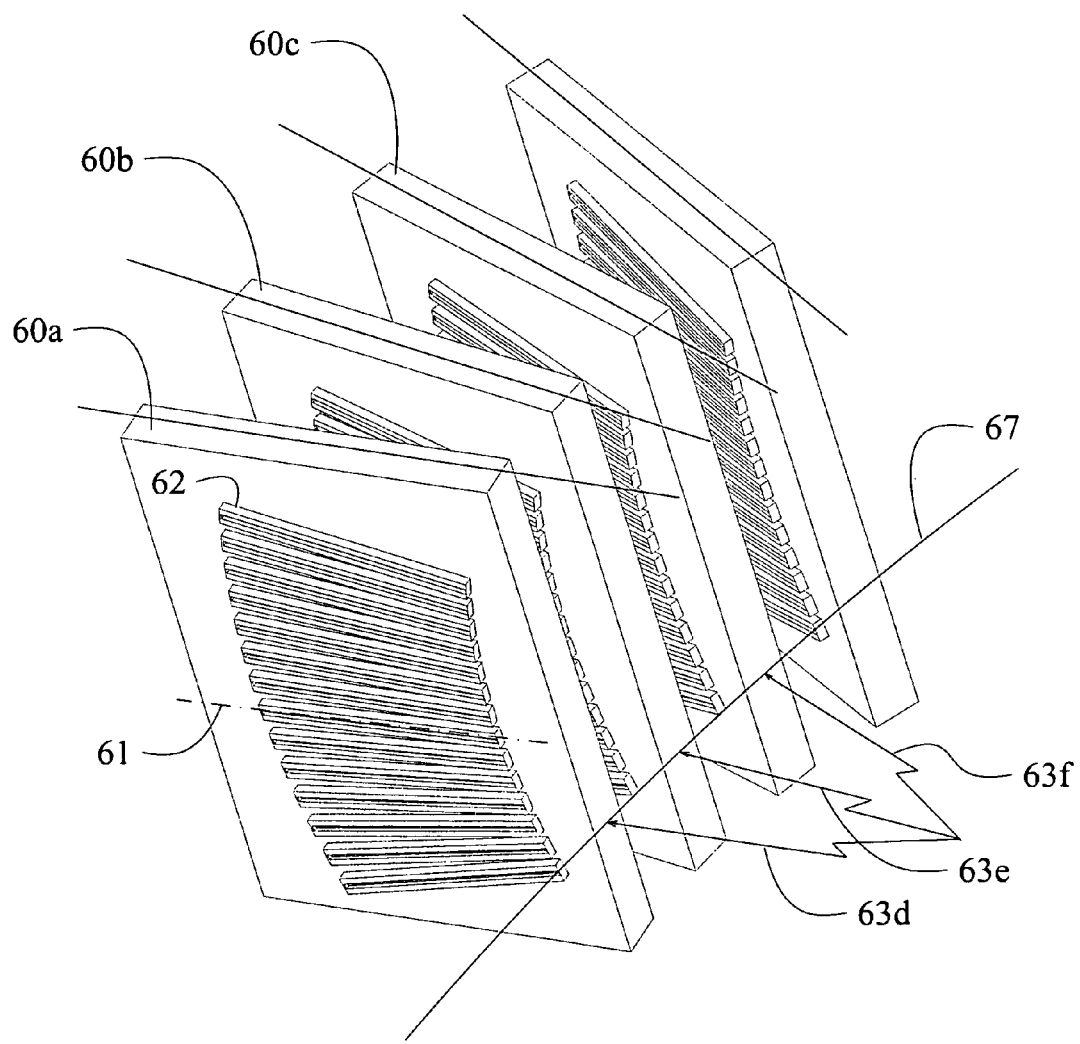
FIG. 7B is a pictorial view of multiple substrates of FIG. 7A mounted in a circular pattern.
Figure 7C:
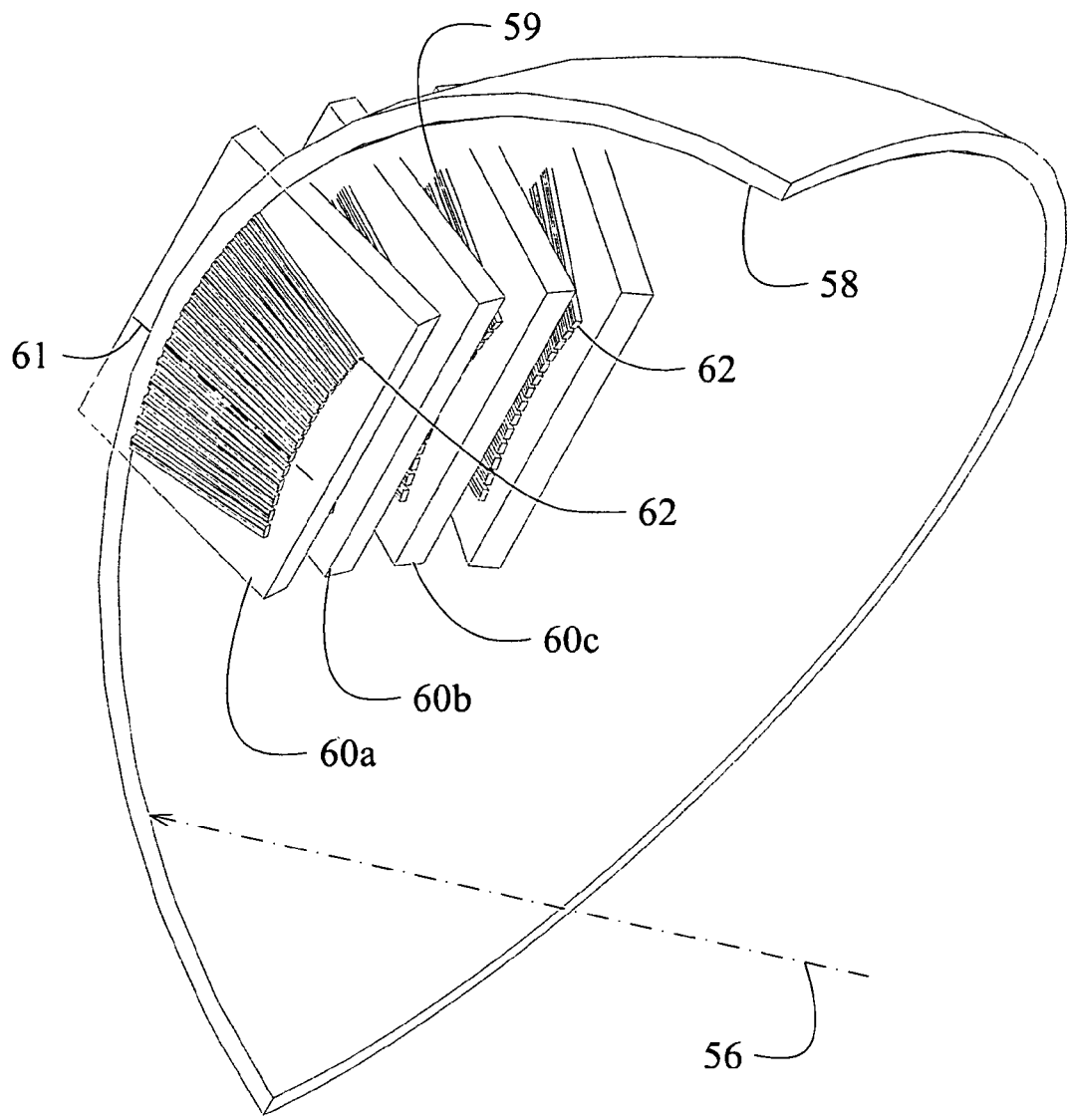
FIG. 7C is a pictorial view of the multiple substrates of FIG. 7B associated with a spherical reflector.

Alternative emitters are employed in an exemplary embodiment shown in FIGS. 7A, 7B and 7C. Stripe geometry lasers (or alternatively stripe geometry amplifiers) are arranged to align along the radii 61 of a spherical reflector 58 (best seen in FIG. 7C) at the extents 59 of the stripe geometry. Stripe geometry devices are fabricated in a circular pattern on a planar substrate 60*a*, with the long axis 61 of each laser 62 lying along a different radius (represented as elements 63*a-c* as exemplary) of a common circle 64 concentric with the spherical reflector. For clarity only a small representative number of stripe geometry lasers are shown in the figures. As shown in FIG. 7B, multiple planar substrates 60*a*, 60*b*, 60*c* are then arranged in a spaced relationship on a circle 67 to form a second dimension for the array, again with each stripe in the adjacent substrates forming the array aligned along radii of circle 67 which is concentric with the spherical reflector (represented as elements 63*d-f* as exemplary).

FIG. 7A shows a single planar array on substrate 60*a*. FIG. 7B shows the array of substrates with the long axis 61, the axis of emission, of each stripe geometry laser aligned with a radius of the sphere. For amplifier devices, a reflective substrate at the extent of the stripe geometry forms the spherical reflector. The embodiment described alternatively employs standard stripe geometry laser diodes or quantum cascade laser.

The array size is limited by the area of the mode at the spherical reflector as described with respect to the initial embodiment. For the embodiments disclosed notionally in FIGS. 7A and 7B, this would encompass 4 to 5 planar substrates each having an array with approximately forty 100 micron wide stripe geometry lasers. The number of stripe geometry lasers per array, and the number of substrates depends on the geometry of each stripe and the substrate area needed to implement device cooling schemes. Depending on the heat load of the array, cooling can be done by thermoelectric cooling, micro-channel cooling or liquid flow through (LFT) cooling.

Embodiments presented herein encompass a two cavity configuration when laser devices are used and a single cavity configuration when amplifier devices are used. Single and multiple quantum well and quantum cascade stripe emitters may also be employed in alternative embodiments.

Figure 8A:
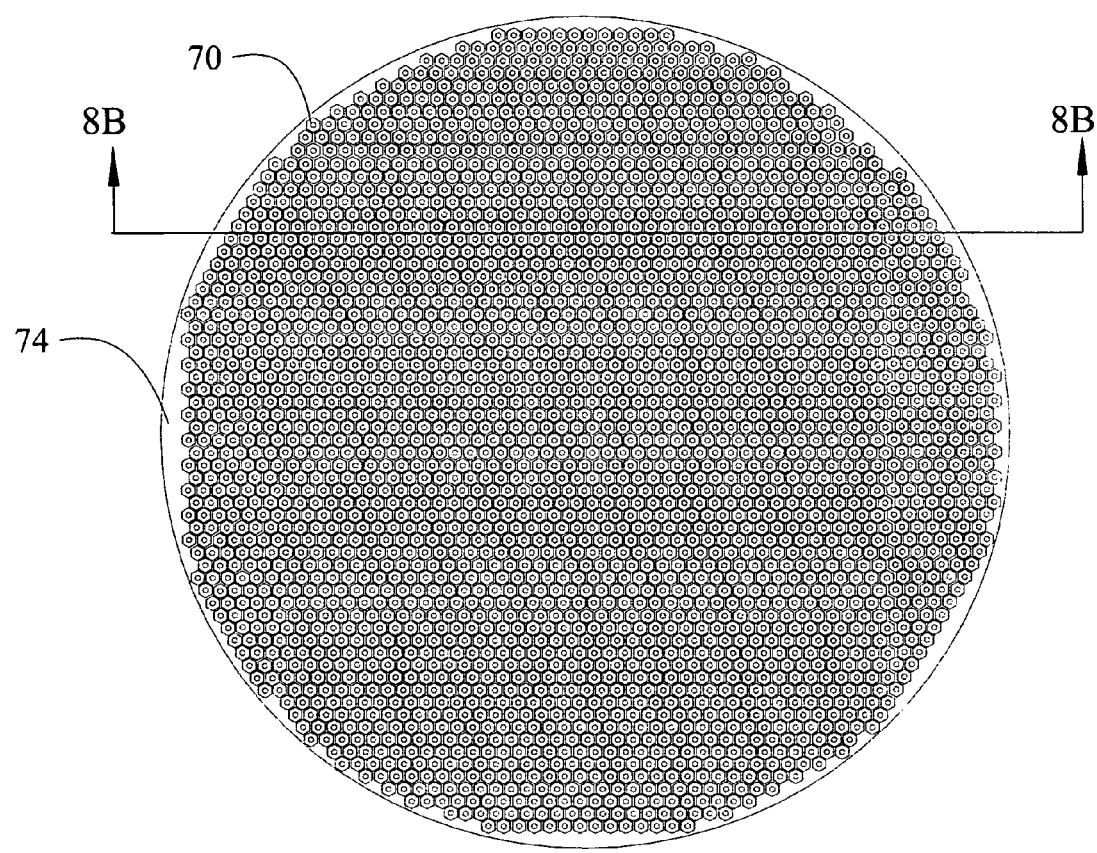
FIG. 8A is a side view of a quantum dot array fabricated with a spherical contour.
Figure 8B:
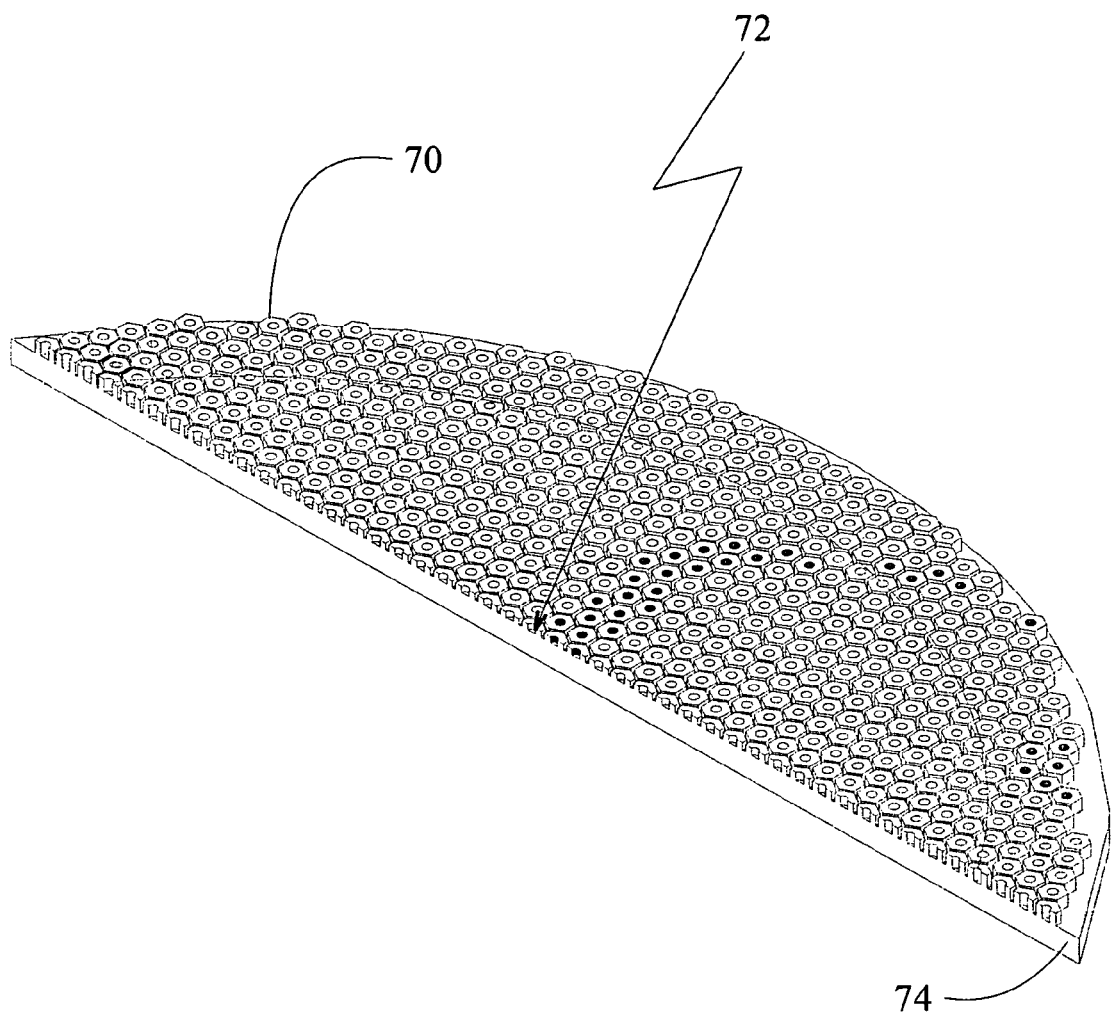
FIG. 8B is a face view of the quantum dot array of FIG. 8A.

Yet another embodiment of the emitter configuration is shown in FIGS. 8A and 8B wherein the array is created by aggregating quantum dot emitters 70, which permit even lower threshold currents, and thus higher wall plug efficiency. As shown in FIG. 8A, the quantum dots are fabricated in an array having a radius 72 corresponding to the spherical cavity. A flat plate 74, best seen in FIG. 8B, provides a substrate for creation of the quantum dot array. For the embodiments described herein, the quantum dot array is fabricated by epitaxial lift-off of the active layer of the quantum dot array and attachment to the spherical substrate surface after lift-off by selective etching. The bias approach for the quantum dots is scaled from the larger VCSEL bias approach previously described.

While embodiments with individual types of emitters have been described, embodiments may combine stripe geometry laser emitters with either VCSEL or quantum dots to form the array. Each type of device should be single mode. Additionally, embodiments may utilize gratings on the fiber to control the mode. Arrays of emitters for the embodiments disclosed may couple laterally which influences the ultimate transverse mode structure. Standard methods to mitigate this issue may be employed with the disclosed embodiments. These methods include, but are not limited to, the cavity design and managing the coupling effects into the single mode fiber. As an example, device structures are employed that confine current to a small area on the device to make it operate in single transverse mode, e.g. a stripe geometry laser wherein the stripe width is in the order of 3 to 5 microns. In an exemplary VCSEL array, current confinement is done by selective oxiding of the side wall of the active layer which contains aluminum in its composition, e.g. AlGaAs, thereby limiting the emitting aperture to about 5 microns.

Figure 9:
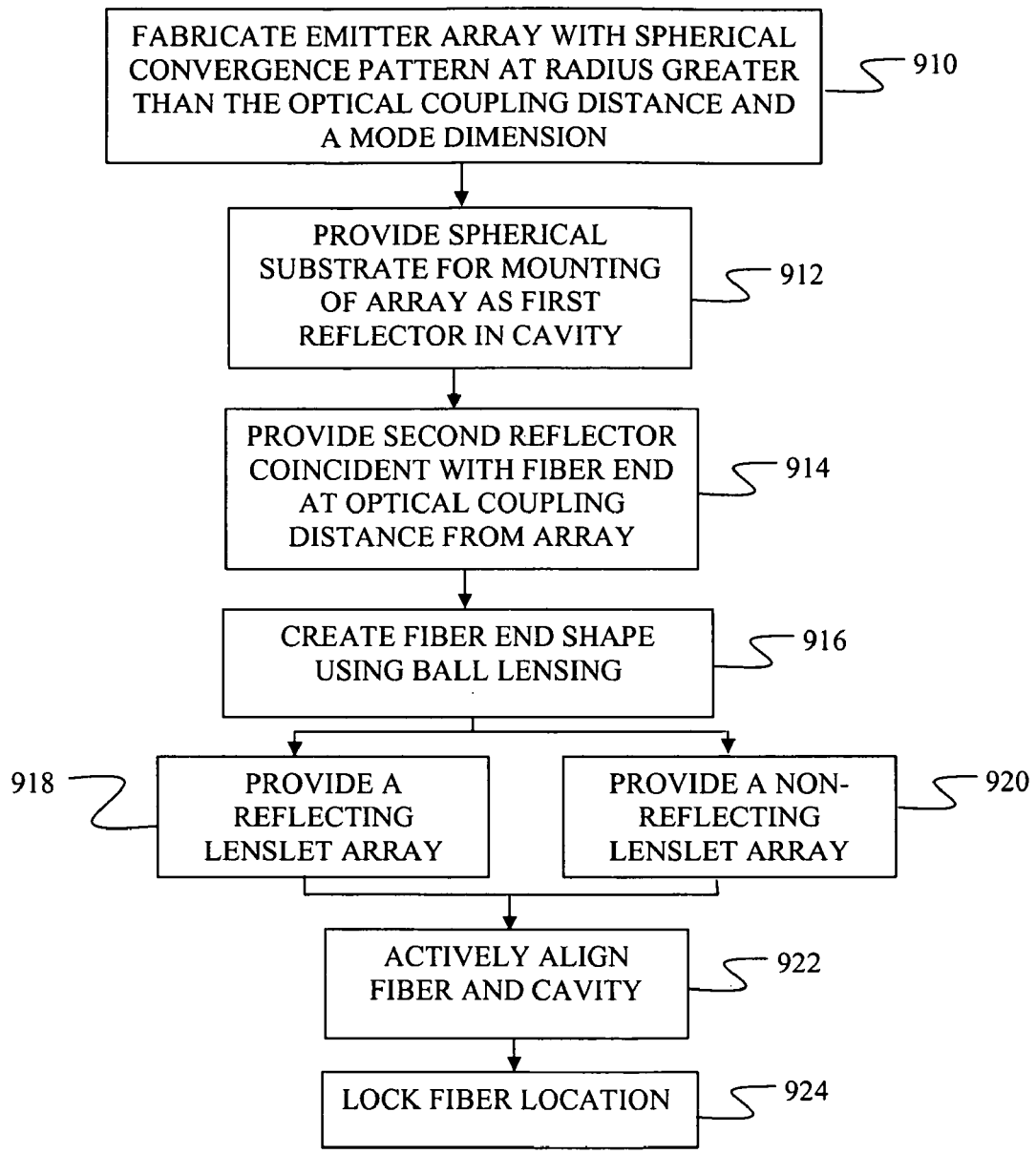
FIG. 9 is a flow chart of the fabrication steps for a laser cavity.

As shown in FIG. 9, a laser cavity is created for each of the embodiments described wherein fabrication of the emitter array is accomplished to provide a spherical convergence pattern from the emitters with a predefined mode dimension at a radius greater than the optical coupling distance to a single mode fiber, step 910. A spherical substrate is provided for mounting an emitter array and acting as a first spherical reflector in the cavity, step 912. In alternative embodiments of the method, the spherical reflector is formed solely by the intrinsic reflector in each emitter or as a reflecting surface on the substrate coincident with the intrinsic reflectors or as a reflecting surface on the substrate at the extent of an array of amplifier devices. Mounting of the emitter array is accomplished by directly forming the array on the spherical substrate or depositing the array on a semiconductor epitaxial layer with multiple quantum well structures in a planar geometry, followed by lift-off of the epitaxial layer and attachment to the substrate. A second reflector for the cavity, which may be limited in extent to the fiber end or extend from the end as a plane perpendicular to the axis of the fiber, is provided at the optical coupling distance coincident with the end of the fiber, step 914. A fiber end shape, flat, hemispherical, hemispherical with tapered transition, or concave, is created using ball lensing to couple the single mode into the fiber, step 916. A lenslet array may be provided for control of light input and output from the emitter array. The lenslet array may be aligned with and attached to the emitter array on a lifted-off epitaxial layer, and then assembled as combined arrays onto the spherical surface. The lenslet array may be reflective to provide a three reflector cavity for laser emitters or a two reflector cavity for amplifiers, step 918, or non-reflective to provide a two reflector cavity for laser emitters, step 920. The fiber and cavity are then aligned, step 922, and the fiber locked into place using, for example, soldering or laser welding, step 924.

Figure 10:
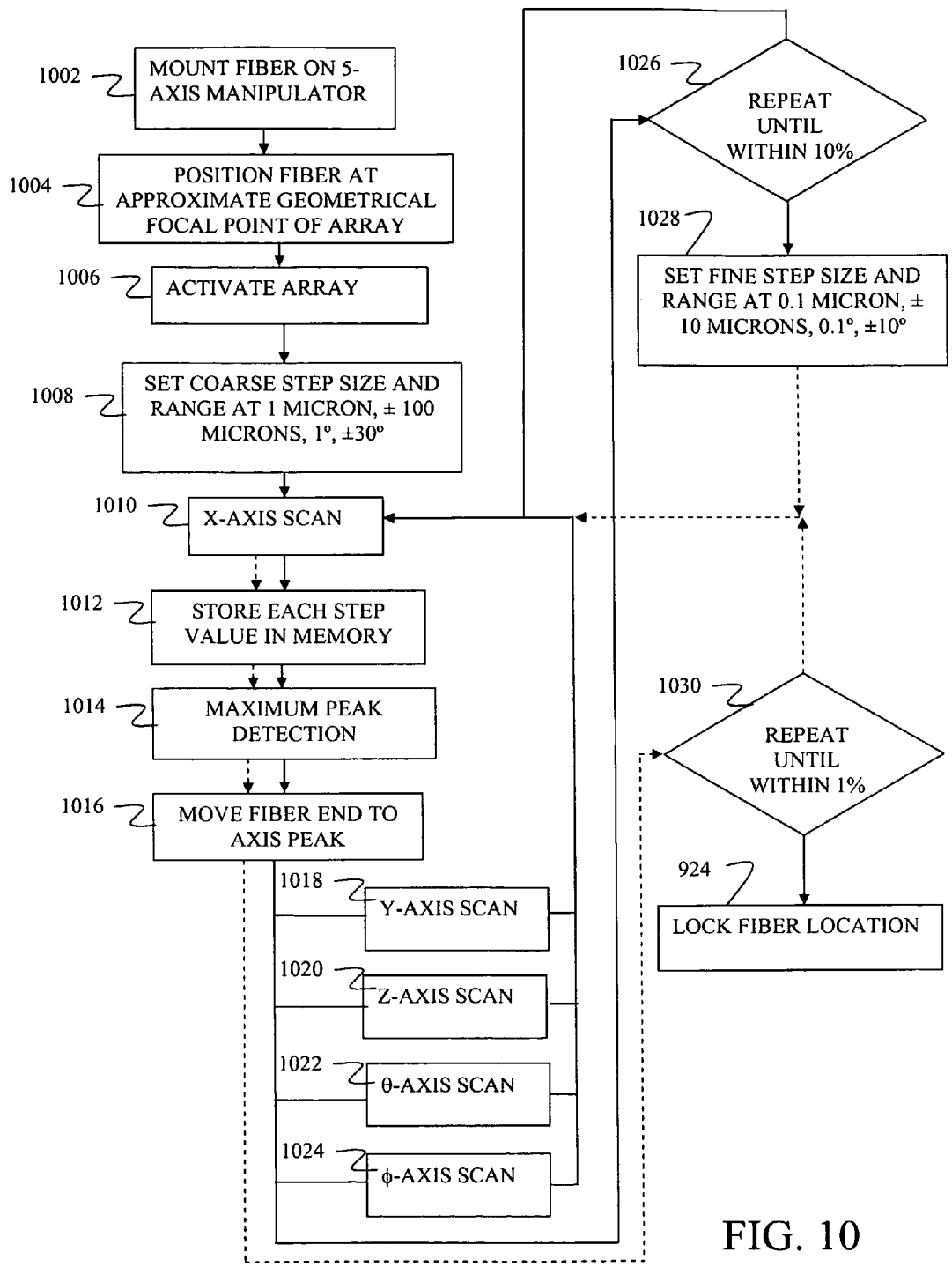
FIG. 10 is a flow chart of the active alignment process for the fiber and cavity.

Fiber alignment with the cavity is accomplished as defined in the method shown in FIG. 10. The fiber alignment optimization is performed by a "Linear Recursive Scanning Search Algorithm", which is described in more detail below.

The fiber is mounted on a fixture attached to a motorized 5-axis (x, y, z, θ and φ) micro-manipulator interfaced with a laptop micro-computer which controls the motions of 5-axis micro-manipulator, step 1002. The micro-manipulator initially positions the fiber in the geometrical focal point of the curved VCSEL (or edge-emitting laser) array before the alignment process begins, step 1004. To commence the active fiber alignment process, the VCSEL (or edge-emitting laser) source is turned on, step 1006, the fiber is stepping through a sequence of coarse and fine search steps for each of the 5 axes. The x, y axis are lateral movements, the z axis is axial movement, θ and φ-axis are the rotation and tilt movements of motorized 5-axis micro-manipulator.

First starting with the coarse steps, the step size is set to 1 micron for each of the x, y and z axes, and the step size is 1° for each of θ and φ axes, step 1008 Using the coarse step size, the fiber is scanned over a range of ±100 microns in the x-axis, step 1010. A matrix of fiber coupled optical power for each step is stored in the memory of the micro-computer which interfaces with the micro-manipulator, step 1012. A searching technique which identifies the maximum peak coupled power in the coupled power matrix and its corresponding location in the x-axis is employed, step 1014. The micro-computer instructs the manipulator to move the fiber to the position corresponding to the maximum peak coupled power in the x-direction, step 1016. After the fiber is moved to the x-position where the maximum coupled power is achieved, the fiber is then scanned in the y-direction by the manipulator, step 1018 with similar algorithm to identify the maximum peak y-position. The fiber is moved by the manipulator to the y-position where a new maximum peak coupled power is found. After the coarse search in y-axis is done, similar coarse search in the z-axis is performed to find the new maximum peak position and move the fiber to this new maximum peak location, step 1020. After the x, y, z search, the angular search is perform for the θ and φ axis in sequence, steps 1022 and 1024. With a 1° coarse step size, the fiber is first rotated in θ-angular range of ±30° a matrix of coupled power corresponds to each step is stored in the computer memory, a similar search algorithm is used to find the location of maximum peak coupled power from the coupled power matrix, the fiber is then rotated to the θ-angular position corresponds to the maximum peak coupled power location. After the scanning in θ-axis, similar search process is performed on the φ-axis, the fiber is scanned on the φ-axis by ±30° with course step size of 1°. A matrix of coupled power for each step is stored in the micro-computer memory, a search routine is performed to find the maximum peak coupled power in the matrix, and the fiber is moved to the φ-axis location corresponding to the maximum peak coupled power to the fiber.

The 5-axis coarse search is repeated until the maximum coupled power is within 10% of the maximum coupled power obtained from the previous 5-axis search, step 1026. Once the coarse alignment is completed, a fine search process on each of the 5 axes is accomplished. The fine search process is similar to the coarse search process, with setting of the step size for the x, y and z axis search at 0.1 micron, the scanning range for each axis at ±10 microns; the step size for the angular axis θ and φ at 0.1°, and the scanning range at ±10°, step 1028. The 5-axis fine scanning is repeated recursively until the final fiber coupled power is within 1% of previous set of 5-axis fine search, step 1030.

The coarse and fine scanning ranges and coarse and fine step sizes are typical examples used for active fiber-to-laser diode alignment. However, other coarse and fine scanning ranges and step sizes can be used. Additional fine search routines with smaller step size (less than 0.1 micron in x, y, z axis and less than 0.1° in θ and φ axis) can be added to this in this "Linear Recursive Scanning Search Algorithm".

The high output power from the spherical laser (VCSEL or edge emitting) array simplifies the active fiber alignment process as described herein because the active fiber alignment process relies on capturing the optical power from the laser source, with the large amount of optical power coming from the array, the fiber can capture the output power very quickly and easily. Therefore the "Linear Recursive Scanning Search Algorithm" can start and complete very quickly with automatic computer controlled software.

Having now described various embodiments of the invention in detail as required by the patent statutes, those skilled in the art will recognize modifications and substitutions to the specific embodiments disclosed herein. Such modifications are within the scope and intent of the present invention as defined in the following claims.

What is claimed is:

1. A laser source comprising:
   a reflecting spherical substrate;
   an array of emitters coincident with the spherical substrate and having a mode dimension, each emitter having an emission axis of symmetry aligned with a radius of the spherical substrate;
   a single mode waveguide aligned with the array at an optical coupling distance less than the radius of the spherical substrate; and,
   a reflector substantially coincident with an end of the waveguide for combination with the reflecting spherical substrate as a cavity.

2. The laser source of claim 1 wherein the waveguide is a fiber having an optical axis aligned with a radius of the spherical substrate extending through a center of the array of emitters.

3. The laser source of claim 2 wherein fiber incorporates a hemispherical end having a partially reflecting coating.

4. The laser source of claim 3 wherein the hemispherical end has a diameter greater than a diameter of the fiber and the fiber further has an interface portion having a tapered diameter from the hemispherical end to the fiber diameter and index for matching modes between the emitter array and fiber.

5. The laser source of claim 1 wherein the array of emitters comprises a vertical cavity surface-emitting laser (VCSEL) array.

6. The laser source of claim 5 wherein the VCSEL array is fabricated on a spherical substrate.

7. The laser source of claim 6 wherein the VCSEL array is fabricated on the reflecting spherical substrate.

8. The laser source of claim 5 wherein the VCSEL array is fabricated on a planar surface for epitaxial liftoff and application to the reflecting spherical substrate.

9. The laser source of claim 1 further comprising a lenslet array intermediate the array of emitters and the waveguide end.

10. The laser source of claim 9 wherein the lenslet array has a reflecting surface.

11. The laser source of claim 1 wherein the array of emitters comprises a plurality of stripe geometry lasers mounted on a second plurality of substrates, each stripe geometry laser aligned with a radius of the reflecting spherical substrate.

12. The laser source of claim 1 wherein the array of emitters comprises quantum dots fabricated in an array having a radius corresponding to the reflecting spherical substrate.

13. The laser source of claim 1 further comprising a multi-layer bias and current return network attached to the emitter array.

14. The laser source of claim 13 wherein the multi-layer bias and current return network is deposited directly onto the reflecting spherical substrate.

15. The laser source of claim 13 wherein the multi-layer bias and current return network is deposited on a flexible membrane.

16. The laser source of claim 15 wherein the membrane is deformed to form the reflecting spherical substrate.

17. A laser cavity comprising:
a reflecting spherical substrate;
an array of VCSEL emitters deposited on a second concentric spherical substrate and having a mode dimension, said second spherical substrate mounted to the reflecting spherical substrate, each emitter having an axis aligned with a radius of the spherical substrate;
a single mode fiber having an end at an optical coupling distance less than the radius of the reflecting spherical substrate with an optical axis of the fiber in alignment with a radius of the reflecting spherical substrate central to the VCSEL array;
a lenslet array intermediate the VCSEL array and the single mode fiber; and,
a reflector substantially coincident with an end of the fiber for combination with the reflecting spherical substrate as a cavity.

18. The laser cavity of claim 17 wherein the lenslet array has a reflecting surface.

19. The laser cavity of claim 17 wherein the fiber end has a hemispherical end with a diameter greater than a diameter of the fiber and the fiber further has an interface portion having a tapered diameter from the hemispherical end to the fiber diameter and index for matching modes between the emitter array and fiber.

20. A laser cavity comprising:
a first plurality of substrates, each substrate having second plurality of stripe geometry devices fabricated thereon, the stripe geometry devices on each substrate aligned on a radius of a first circle and each of the substrates aligned in spaced relation perpendicular to a second circle, said first and second circle defining a sphere;
a spherical reflector at an extent of the stripe geometry devices;
a single mode fiber having an end at an optical coupling distance less than the radius of the reflective substrate with an optical axis of the fiber in alignment with a radius of the reflecting substrate central to the second plurality of stripe geometry lasers; and,
a reflector substantially coincident with an end of the fiber for combination with the reflecting spherical substrate as a cavity.

21. The laser cavity of claim 20 further comprising a lenslet array intermediate the stripe geometry lasers and the end of the single mode fiber.

22. The laser cavity of claim 21 wherein the lenslet array has a reflecting surface.

23. The laser cavity of claim 22 wherein the stripe geometry devices are amplifiers.

24. A method for fabricating a laser cavity comprising:
providing an emitter array with a spherical convergence pattern from the emitters and with a predefined mode dimension at a radius greater than an optical coupling distance to a single mode fiber;
providing a spherical reflector coincident with the emitter array and acting as a first reflector in the cavity;
providing a second reflector for the cavity at the optical coupling distance coincident with an end of the fiber; and,
actively optimizing the fiber end location with respect to the cavity.

25. The method of claim 24 further comprising:
providing a lenslet array for control of light input and output from the emitter array.

* * * * *